United States Patent [19]

Arcara

[11] Patent Number: 4,584,566
[45] Date of Patent: Apr. 22, 1986

[54] ANALOG TO DIGITAL CONVERTER

[75] Inventor: Samuel A. Arcara, Doylestown, Pa.

[73] Assignee: Honeywell Inc., Minneapolis, Minn.

[21] Appl. No.: 685,105

[22] Filed: Dec. 21, 1984

[51] Int. Cl.[4] .............................................. H03K 13/02
[52] U.S. Cl. ........................ 340/347 AD; 340/347 NT
[58] Field of Search ................... 340/347 AD, 34 NT

[56] References Cited

U.S. PATENT DOCUMENTS

| Re. 28,706 | 2/1976 | Dorey | 340/347 NT |
|---|---|---|---|
| Re. 28,833 | 5/1976 | Dorey | 340/347 NT |
| 3,745,556 | 5/1971 | Dorey | 340/347 AD |
| 4,031,532 | 6/1977 | First | 340/347 NT |
| 4,161,724 | 7/1979 | Smutny | 340/347 NT |
| 4,164,733 | 8/1979 | Landsburg et al. | 340/347 NT |
| 4,354,176 | 10/1982 | Aihara | 340/347 NT |

*Primary Examiner*—Vit W. Miska
*Attorney, Agent, or Firm*—Mitchell J. Halista; Trevor B. Joike

[57] ABSTRACT

An analog to digital converter uses an integrator having an input to which is applied the unknown voltage to be converted. An opposing reference voltage is switched by a switch means between positive and negative levels to cause the integrator output to ramp up and down between two levels to produce a periodic sawtooth waveform. The sawtooth waveform is applied to a hysteresis comparator which changes its output state when the sawtooth wave form magnitude equals the upper and lower hyteresis levels of the comparator. The output of the comparator is arranged to trigger an edge-sensitive "D" flip-flop. A fixed frequency clock signal from a clock signal source is applied to a clock input of the flip-flop to switch the flip-flop in combination with the output from the comparator. An output signal from one side of the flip-flop is applied as an actuating signal to the switch means to switch the reference signal level. An output signal from the other side of the flip-flop as well as the clock output from the clock signal source is applied to a 3-input AND gate to be combined with an output from a frequency divider arranged to divide the clock signal by a predetermined number. Thus, the operation of the AND gate between its open and closed states is synchronized with the occurrence of the clock signal. The output signal from the AND gate representing the clock signals passed through the AND gate is applied to a counter to be counted. The total number of clock pulses counted during the time period during which the AND gate is open is representative of the amplitude of the input signal to be converted. The stored count from the counter is periodically read out by an output signal from a control circuit triggered by the output from the frequency dividing circuit.

5 Claims, 4 Drawing Figures

ANALOG TO DIGITAL CONVERTER

BACKGROUND OF THE INVENTION

1. Field of the Invention

The present invention relates to analog to digital converters. More specifically, the present invention is directed to an integrating analog to digital converter which converts an analog signal to a corresponding digital count.

2. Description of the Prior Art

A common method of analog to digital conversion is to employ circuit techniques which translate a voltage input signal to be converted into a time duration signal which is proportional to the voltage input signal. The time duration signal is usually obtained by integrating the input signal and, subsequently, converting the triangular ramp output of the integrator into a variable duty cycle square-wave signal by a comparator operating between threshold limits. The time duration of the square-wave signal is then converted into a digital output form by counting clock cycles from a fixed frequency oscillator during the period or time duration of the square-wave signal, e.g., the analog to digital converter shown in U.S. Pat. No. 3,745,556. However, such prior art converters fail to provide a synchronization of the clock to the time duration signal to prevent false clocking of the duty cycle measuring counter. Such a lack of synchronization is effective to provide a false count by $\pm N$ clock pulses where N is the number of triangle wave cycles at the output of the integrator which results in an error in the digital representation of the input signals to be converted. Accordingly, it is desirable to provide an analog to digital converter having means for overcoming the aforesaid inherent disadvantage of the prior art converters.

SUMMARY OF THE INVENTION

An object of the present invention is to provide an improved analog to digital converter for converting an analog input signal into a digital count representative of the magnitude of the analog input signal.

In accomplishing this and other objects, there has been provided, in accordance with the present invention, an analog to digital converter comprising integrating means having an input and an output, means for applying an electrical signal to be converted to the input of the integrating means, switch means for selectively applying a positive and a negative reference signal opposing the input signal to the input of the integrating means, the integrating means being responsive to the application of the input signal and the second signal to produce an output signal at the output of the integrating means which ramps up and down between the positive and negative limits of the reference signal, level detection means responsive to two different levels of the integrator output signal to cause an output signal from the detection means to switch alternately between a first and a second state when the two levels are reached alternately by the output signal from the integrator means, flip-flop means responsive to a start edge of input signals applied thereto and having a signal input and a clock input, the signal input being connected to an output of the detector means, fixed frequency clock signal generating means arranged to supply clock signals to the clock input of the flip-flop means, AND gate means arranged to receive an output signal from the clock means and an output signal from one side of the flip-flop means, circuit means for connecting an output signal from the other side of said flip-flop means as an energizing signal to said switch means, and counter means arranged to count output signals from the AND gate means.

BRIEF DESCRIPTION OF THE DRAWINGS

A better understanding of the present invention may be had when the following detailed description is read in connection with the accompanying drawings, in which.

DESCRIPTION OF THE PREFERRED EMBODIMENT

Figure 1:
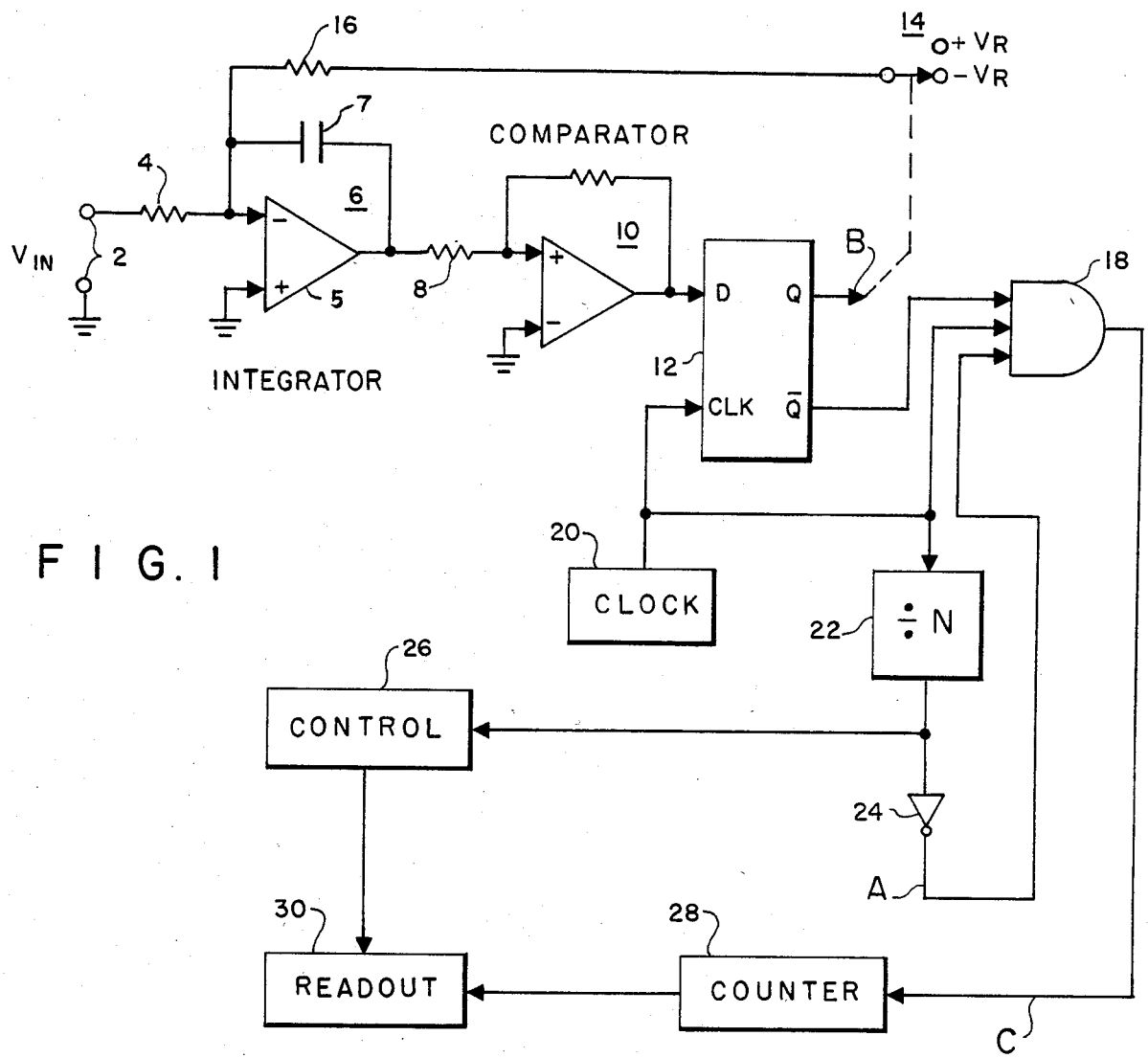
FIG. 1 is a block diagram of an analog to digital converter embodying an example of the present invention.

Referring to FIG. 1 in more detail, there is shown a block diagram of an analog to digital converter embodying an example of the present invention and having a pair of input terminals 2 to which an input signal to be converted is applied. One of the input terminals 2 is connected to a ground connection while the other one of the inputs terminals 2 is connected through an input resistor 4 to an inverting input of an operational amplifier 5 used in an integrator 6. The noninverting input of the amplifier 5 is connected to a ground connection. A feedback capacitor 7 is connected between the output of the amplifier 5 and the inverting input of the amplifier 5. An output of the integrator 6 is connected through an input resistor 8 to an noninverting input of a hysteresis-type comparator 10. The inverting input of the hysteresis comparator 10 is connected to a ground connection. The hysteresis comparator 10 may be any suitable device having upper and lower hysteresis or threshold levels which define input signal levels that are effective to change the output of the comparator, i.e., an input signal to the compartor 10 achieving a magnitude equal to either the upper or lower hysteresis levels.

The output of the comparator 10 is applied to the "D" input of a "D" flip-flop 12. The "D" flip-flop 12 is an edge-sensitive flip-flop such as the one manufactured by RCA Corp. and identified as Model No. 4013. A Q output from the flip-flop 12 is arranged to control a single pole, double switch 14 for selectively connecting either a positive or a negative reference signal through a resistor 16 to the inverting input of the integrator 6 in opposition to the input signal applied thereto from input terminals 2. A Q output from the flip-flop 12 is connected to one input of a 3-input AND gate 18.

A second input for the AND gate 18 is obtained from the output of a fixed frequency clock signal source 20. The output of the clock source 20 is also applied to the "clock" input of the flip-flop 12 and to the input of a frequency divider circuit 22 which is arranged to divide the frequency of the clock signal by a fixed integer N. An output signal from the frequency divider 22 is applied through a logic inverter 24 to the third input of the AND gate 18. The output from the frequency divider 22 is also applied to a readout control circuit 26. An output signal from the AND gate 18 is applied to a counter 28 arranged to count the clock signals passing through the AND gate 18. The count stored in the counter 28 is read out by a readout circuit controlled by the control circuit 26 to provide a digital representation of the input signal applied to the input terminals 2 which may be in the form of a visible display, a printout on a recording medium or other readout application, e.g., a digital signal for a process control which may involve a microprocessor and digital memory for storing the count.

Figure 3:
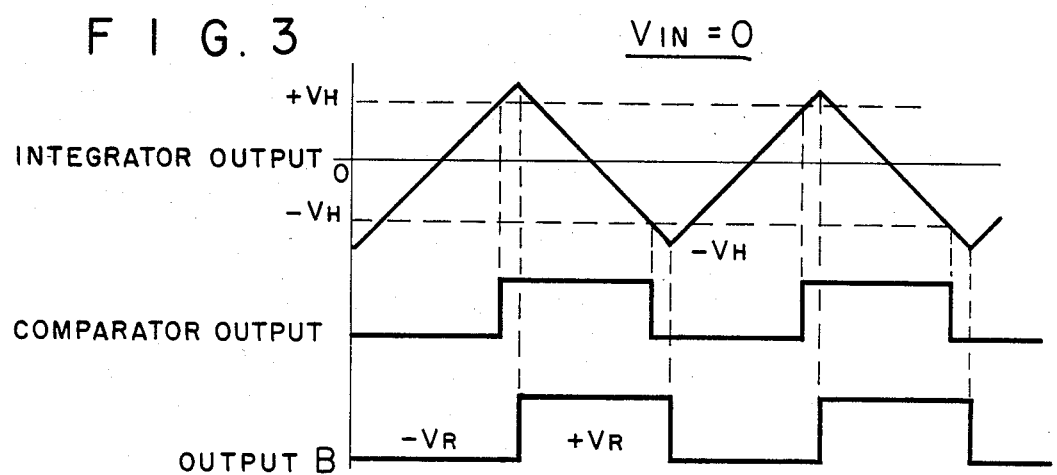
Figure 4:
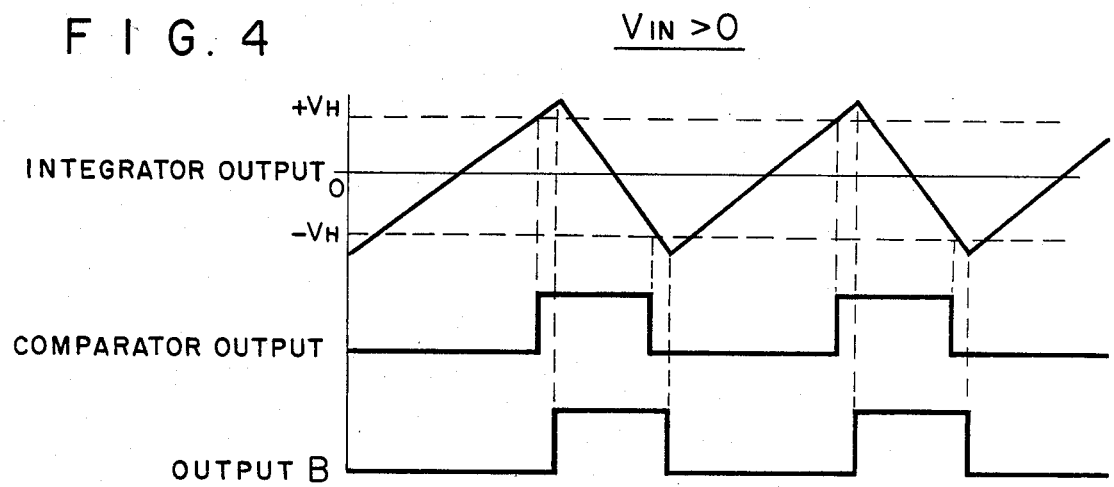

In operation, the input signal to be converted is applied to the input terminals 2 to apply a current through the input resistor 4 to the operational amplifier 5 used in the integrator 6. The output of the integrator amplifier 5 is fed back through the feedback capacitor 7 as a ramp signal and is applied to the comparator 10. The comparator 10 is arranged to compare the output signal from the integrator 6 with its positive and negative hysteresis or threshold levels. The integrator 6 sums and integrates the current supplied by the input signal and the current supplied by the switch 14 from either the positive or the negative reference sources $+V_R$, $-V_R$. Referring to FIGS. 3 and 4 and assuming that the switch is in the $+V_R$ position and the input signal is positive, the output of the integrator 6 will ramp down until it reaches the threshold of the hysteresis voltage $-V_H$ at which point the comparator output will change, e.g., from a logic "1" to a logic "0".

On the next clock signal edge received by the flip-flop 12, the outputs of the flip-flop 12 will change state wherein the "Q" output will change to a logic "0" which is effective to change the position of the switch 14 to the $-V_R$ position. This position of switch 14 causes the integrator output to ramp up toward $+V_H$ at which point the comparator output will change back to a logic "1". On the next clock signal edge, the flip-flop 12 will return to a condition where the "Q" output is a logic "1". The feedback provided by the resistor 16 adjusts the duty cycle of the flip-flop 12 to maintain an average value of zero volts across the integrating capacitor 7. This condition is met when the sum of the current supplied by the input signal $I_2$ and the average value of the current supplied from the reference sources $I_1$ is 0, i.e., $I_2 = I_1$. The average value of $I_1$ expressed in terms of the duty cycle and the reference voltage is: $2DV_r/R_1 - V_r/R_1$. Solving for the duty cycle D by substitution of equations with $I_2 = V_{in}/R_2$ yields: $D = (R_1/R_2)(V_{in}/2V_r + 0.5)$. The duty cycle therefore is directly proportional to the ratio of the input voltage to the reference voltage.

Figure 2:
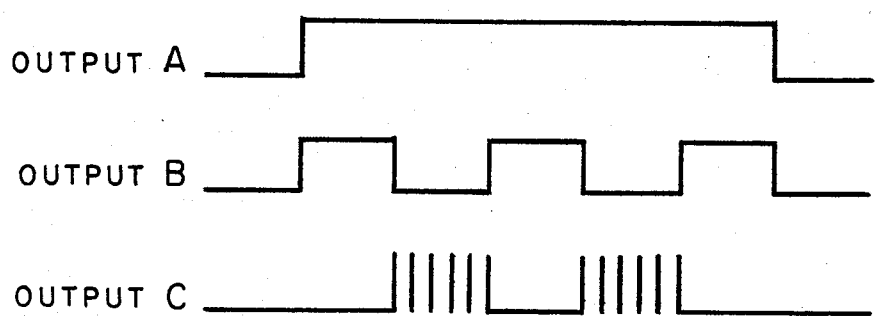
FIG. 2 is a wave shape diagram showing selected wave shapes which occur in the circuit of FIG. 1 and FIGS. 3 and 4 are waveshapes which occur in the circuit of FIG. 1 under respective input signal conditions.

Since the flip-flop 12 can only change state on the occurrence of a clock signal edge, the measurement of the duty cycle is made by gating the clock signal from the clock signal source 20 with the output of the flip-flop 12 for a number of clock cycles through the AND gate 18 as shown in FIG. 2. The ratio of the number of gated clock cycles C to the number of fixed clock cycles N is proportional to the duty cycle output and therefore proportional to the input voltage $V_{In}$, i.e., $$V_R \frac{C}{N} = V_{In}.$$

The present invention effectively synchronizes the clock signal to the change in the state of the flip-flop 12. This synchronization prevents random variations in the output count due to premature termination of a clock cycle which can cause a $+N$ or $-N$ variation in the output count where N is the number of triangular wave cycles at the output of the integrator 6. Accordingly, the transition of the state of the flip-flop 12 is delayed until the occurrence to the next clock cycle whereby the clock and the output ramp signal of the integrator 6 are synchronized.

Accordingly, there has been provided, in accordance with the present invention, an improved analog to digital converter.

The embodiments of the present invention in which an exclusive property or privilege is claimed are defined as follows:

1. An analog to digital converter comprising
   integrating means having an input and an output,
   means for applying an electrical signal to be converted to the input of the integrating means,
   switch means for selectively applying a positive and a negative reference signal opposing said input signal to said input of said integrating means, said integrating means being responsive to the application of the input signal and said second signal to produce an output signal at said output of said integrating means which ramps up and down between the positive and negative limits of the reference signal,
   level detection means responsive to two different levels of said integrator output signal to cause an output signal from said detection means to switch alternately between a first and a second state when said two levels are alternately reached by said output signal from said integrator means,
   flip-flop means responsive to a start edge of input signals applied thereto and having a signal input and a clock input, said signal input being connected to an output of said detector means,
   fixed frequency clock signal generating means arranged to supply clock signals to the clock input of said flip-flop means,
   frequency dividing means for dividing said clock signals from said clock means by a fixed integer,
   three input AND gate means arranged to receive an output signal from said clock means as a first input, an output signal from said frequency dividing means as a second input and an output signal from one side of said flip-flop means as a third input,
   circuit means for connecting an output signal from the other side of said flip-flop means as an energizing signal to said switch means, and
   counter means arranged to count output signals from said AND gate means.

2. An analog to digital converter as forth in claim 1 wherein said signal applied to said AND gate means is taken from the $\overline{Q}$ output of said flip-flop means.

3. An analog to digital converter as set forth in claim 1 wherein said counter means includes readout means responsive to said output signal from said dividing means to readout a count stored in said counter means.

4. An analog to digital converter means as set forth in claim 1 wherein said integrator means includes an operational amplifier having a capacitive negative feedback circuit to apply a feedback signal to be summed with said input signal to be converted.

5. An analog to digital converter as set forth in claim 5 wherein said level detection means includes an operational amplifier having a positive feedback to form a hysteresis type signal comparator.

* * * * *